United States Patent
Basceri et al.

(10) Patent No.: US 7,323,738 B2
(45) Date of Patent: Jan. 29, 2008

(54) MIS CAPACITOR AND METHOD OF FORMATION

(75) Inventors: Cem Basceri, Boise, ID (US); Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/545,481

(22) Filed: Oct. 11, 2006

(65) Prior Publication Data

US 2007/0138529 A1 Jun. 21, 2007

Related U.S. Application Data

(62) Division of application No. 10/145,993, filed on May 16, 2002, now Pat. No. 7,164,165.

(51) Int. Cl.
*H01L 27/108* (2006.01)
*H01L 29/76* (2006.01)
*H01L 29/94* (2006.01)
*H01L 31/119* (2006.01)

(52) U.S. Cl. .................. 257/296; 257/303; 257/306; 257/E27.086

(58) Field of Classification Search ........ 257/295–296, 257/303–304, 306–310, E27.048, E27.086, 257/E27.087, E27.088
See application file for complete search history.

(56) References Cited

U.S. PATENT DOCUMENTS

| 6,027,970 | A | 2/2000 | Sharan et al. |
|---|---|---|---|
| 6,046,084 | A | 4/2000 | Wei et al. |
| 6,165,830 | A | 12/2000 | Lin et al. |
| 6,171,955 | B1 | 1/2001 | Chen |
| 6,316,800 | B1 | 11/2001 | Al-Shareef et al. |
| 6,492,241 | B1 | 12/2002 | Rhodes et al. |
| 6,753,618 | B2 | 6/2004 | Basceri et al. |
| 6,780,704 | B1 | 8/2004 | Raaijmakers et al. |
| 6,794,255 | B1 | 9/2004 | Forbes et al. |
| 6,870,210 | B2 | 3/2005 | Ping et al. |
| 6,881,642 | B2 | 4/2005 | Basceri et al. |
| 2001/0024387 | A1 | 9/2001 | Raaijmakers et al. |
| 2002/0000596 | A1 | 1/2002 | Carstensen |
| 2002/0036312 | A1 | 3/2002 | Bertagnolli et al. |

(Continued)

OTHER PUBLICATIONS

M. Gutsche et al., "Capacitance Enhancement Techniques for Sub-100nm Trench DRAMs", International Electron Devices Meeting, 2001; Dec. 2001, pp. 18.6.1 to 18.6.4.

*Primary Examiner*—Hoai v Pham
(74) *Attorney, Agent, or Firm*—Dickstein Shapiro LLP

(57) ABSTRACT

An MIS capacitor with low leakage and high capacitance is disclosed. A layer of hemispherical grained polysilicon (HSG) is formed as a lower electrode. Prior to the dielectric formation, the hemispherical grained polysilicon layer may be optionally subjected to a nitridization or anneal process. A dielectric layer of aluminum oxide ($Al_2O_3$), or a composite stack of interleaved layers of aluminum oxide and other metal oxide dielectric materials, is fabricated over the hemispherical grained polysilicon layer and after the optional nitridization or anneal process. The dielectric layer of aluminum oxide ($Al_2O_3$) or the aluminum oxide composite stack may be optionally subjected to a post-deposition treatment to further increase the capacitance and decrease the leakage current. A metal nitride upper electrode is formed over the dielectric layer or the composite stack by a deposition technique or by atomic layer deposition.

4 Claims, 12 Drawing Sheets

U.S. PATENT DOCUMENTS

| | | |
|---|---|---|
| 2002/0086556 A1 | 7/2002 | Ahn et al. |
| 2002/0098646 A1 | 7/2002 | Hirano et al. |
| 2003/0052358 A1 | 3/2003 | Weimer |
| 2003/0064566 A1 | 4/2003 | Yang et al. |
| 2003/0075802 A1 | 4/2003 | Derraa et al. |
| 2003/0136988 A1 | 7/2003 | Zheng et al. |
| 2003/0168750 A1 | 9/2003 | Basceri et al. |
| 2003/0205729 A1 | 11/2003 | Basceri et al. |
| 2003/0213987 A1 | 11/2003 | Basceri et al. |
| 2003/0232497 A1 | 12/2003 | Xi et al. |
| 2004/0036102 A1 | 2/2004 | Sell et al. |
| 2004/0046197 A1 | 3/2004 | Basceri et al. |

MIS CAPACITOR AND METHOD OF FORMATION

CROSS REFERENCE TO RELATED APPLICATIONS

The present application is a divisional of U.S. application Ser. No. 10/145,993, filed on May 16, 2002, now U.S. Pat. No. 7,164,165, the disclosure of which is herewith incorporated by reference in its entirety.

FIELD OF THE INVENTION

The present invention relates to the field of integrated circuits and, in particular, to a novel method of forming capacitor structures.

BACKGROUND OF THE INVENTION

A dynamic random access memory (DRAM) cell typically comprises a charge storage capacitor coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance $C=\epsilon \epsilon_o A/d$, where $\epsilon$ is the dielectric constant of the capacitor dielectric, $\epsilon_o$ is the vacuum permittivity, A is the electrode (or storage node) area, and d is the interelectrode spacing. The conditions of DRAM operation, such as operating voltage, leakage rate and refresh rate, will in general mandate that a certain minimum charge be stored by the capacitor.

In the continuing trend to higher memory capacity, the packing density of storage cells must increase, yet each must maintain required capacitance levels. This is a crucial demand of DRAM fabrication technologies if future generations of expanded memory array devices are to be successfully manufactured. Nevertheless, in the trend to higher memory capacity, the packing density of cell capacitors has increased at the expense of available cell area. For example, the area allowed for a single cell in a 64-Mbit DRAM is only about 1.4 $\mu m^2$. In such limited areas, it is difficult to provide sufficient capacitance using conventional stacked capacitor structures. Yet, design and operational parameters determine the minimum charge required for reliable operation of the memory cell despite decreasing cell area.

Several techniques have been developed to increase the total charge capacity or the capacitance of the cell capacitor without significantly affecting the cell area.

For example, new capacitor dielectric materials with high dielectric constants have been introduced to replace conventional dielectric materials such as silicon nitride. This way, thin films of materials having a high dielectric constant, such as $Ta_2O_5$ (tantalum pentoxide), Barium Titanate (BT), Strontium Titanate (ST), Lead Zirconium Titanate (PZT), or Bismuth Strontium Titanate (BST), have been increasingly utilized as the cell dielectric material of choice of DRAMs. Although these materials have a high dielectric constant and low leakage currents, there are some technical difficulties associated with these materials.

One problem with incorporating these materials into current DRAM cell designs is their chemical reactivity with the polycrystalline silicon (polysilicon or "poly") that conventionally forms a capacitor electrode of a metal-insulator-semiconductor (MIS) capacitor. Capacitors made of polysilicon-PZT/BST sandwiches undergo chemical and physical degradation with thermal processing. During the chemical vapor deposition (CVD) of PZT/BST, oxygen in the ambient tends to oxidize the electrode material. The oxide is undesirable because it has a much lower dielectric constant compared to that of PZT/BST, and adds in series to the capacitance of the PZT/BST, thus drastically lowering the total capacitance of the capacitor. Thus, even a thin native oxide layer present on the electrode results in a large degradation in capacitance.

Accordingly, there is a need for a method of forming a metal-insulator-semiconductor (MIS) capacitor having increased capacitance per cell and low leakage, as well as a method of forming a capacitor structure that achieves high storage capacitance without increasing the size of the capacitor. An MIS capacitor with increased capacitance and reduced leakage current is also needed.

BRIEF SUMMARY OF THE INVENTION

The present invention provides an MIS capacitor and a method of forming an MIS capacitor with low leakage and high capacitance.

The MIS capacitor of the present invention comprises a layer of hemispherical grained polysilicon (HSG) as a lower capacitor electrode, which may be optionally nitridized or oxidized. A dielectric layer comprising aluminum oxide ($Al_2O_3$), or a dielectric composite stack comprising one or more layers of $Al_2O_3$ interleaved with one or more layers of other dielectric metal oxides, is provided over the layer of hemispherical grained polysilicon (HSG). An upper electrode of a metal nitride layer is formed over the dielectric layer or the dielectric composite stack.

The present invention also provides a method of forming an MIS capacitor with reduced leakage current and high capacitance. A layer of hemispherical grained polysilicon (HSG) is formed as a lower electrode. After its formation and prior to the dielectric formation, the layer of hemispherical grained polysilicon (HSG) may be subsequently subjected to a nitridization or an anneal process to passivate the HSG surface and improve the cell capacitance and the leakage. A dielectric layer comprising aluminum oxide ($Al_2O_3$), or a dielectric composite stack comprising a plurality of interleaved layers of $Al_2O_3$ and other dielectric oxides, is formed over the layer of hemispherical grained polysilicon (HSG) by atomic layer deposition (ALD), for example. The dielectric layer or the dielectric composite stack is optionally subjected to a post-dielectric deposition treatment, for example, a nitridization or an anneal treatment, to further reduce leakage and increase the dielectric stability. An upper electrode of metal nitride material is formed over the dielectric layer or the dielectric composite stack by a deposition process or by an atomic layer deposition (ALD) method.

The foregoing and other advantages and features of the invention will be better understood from the following detailed description of the invention, which is provided in connection with the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical changes may be made.

The term "substrate" used in the following description may include any semiconductor-based structure that has a semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor also need not be silicon-based. The semiconductor could be silicon-germanium, germanium, or gallium arsenide. When reference is made to a substrate in the following description, previous process steps may have been utilized to form regions or junctions in or on the base semiconductor or foundation.

The term "metal" is intended to include not only elemental metal, but metal with other trace metals or in various alloyed combinations with other metals as known in the semiconductor art, as long as such alloy remains electrically conductive. Similarly, the term "aluminum oxide" includes not only elemental aluminum oxide, but aluminum oxide with other trace materials or in various alloyed combinations as known in the semiconductor art, as long as such alloy or combination retains the physical and electrical properties of aluminum oxide.

Figure 1:
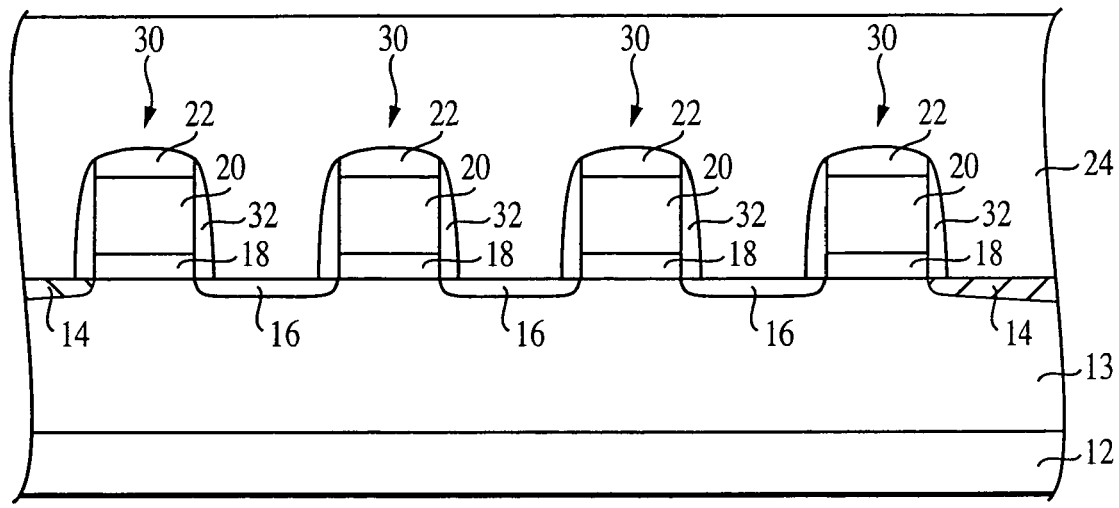
FIG. 1 is a schematic cross-sectional view of a portion of a memory DRAM device, in which an MIS capacitor will be fabricated according to a method of the present invention.

Referring now to the drawings, where like elements are designated by like reference numerals, FIG. 1 depicts a memory cell construction for a DRAM at an intermediate stage of the fabrication, in which a pair of memory cells having respective access transistors are formed on a substrate 12. The FIG. 1 structure includes the substrate 12 having a well 13, which is typically doped to a predetermined conductivity, for example p-type or n-type depending on whether NMOS or PMOS transistors will be formed therein. The structure further includes field oxide regions 14, conventional doped active areas 16 for use as source/drain regions, and a pair of gate stacks 30, all formed according to well-known semiconductor processing techniques. The gate stacks 30 include a gate oxide layer 18, a conductive gate layer 20, such as polysilicon or polysilicon covered by a silicide, nitride spacers 32 and a nitride cap 22.

Above the gate oxide region 18, the polysilicon gates 20, and the protective nitride regions 22, 32, a first insulating layer 24 (FIG. 1) is disposed. Insulating layer 24 could be formed of silicon oxide, borophosphosilicate glass (BPSG), borosilicate glass (BSG), or phosphosilicate glass (PSG), among others.

Figure 2:
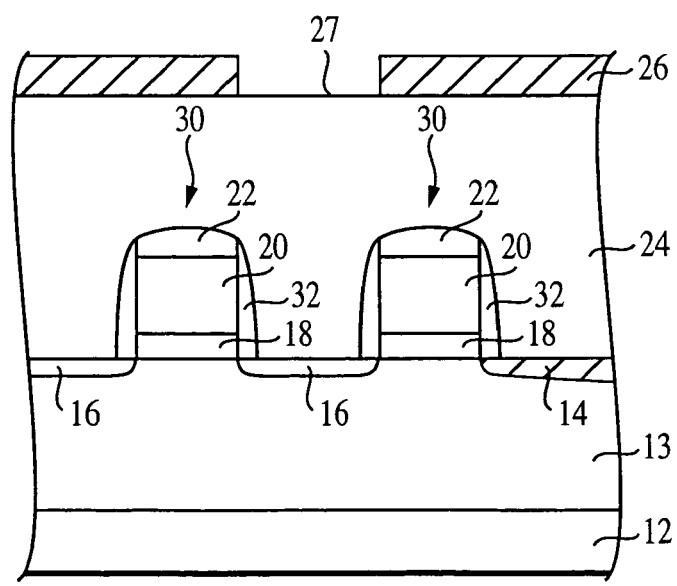
FIG. 2 is a schematic cross-sectional view of the FIG. 1 device at a stage of processing subsequent to that shown in FIG. 1.
Figure 3:
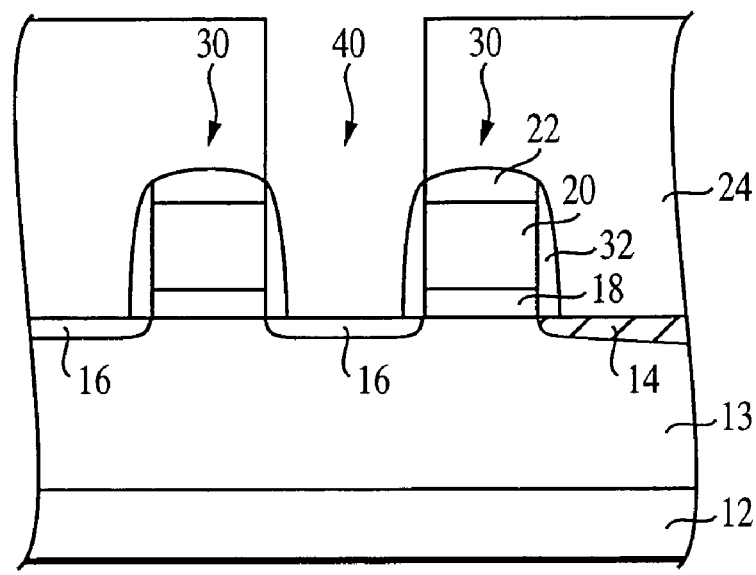
FIG. 3 is a schematic cross-sectional view of the FIG. 1 device at a stage of processing subsequent to that shown in FIG. 2.

Reference is now made to FIG. 2, which for simplicity illustrates only a lateral portion, for example, the right side portion of FIG. 1. This is a region where a contact plug and an overlying MIS capacitor structure 100 (FIG. 18) fabricated according to exemplary embodiments of the present invention will be formed. To create a contact opening 40 (FIG. 3) into the substrate 12 through the first insulating layer 24, a photoresist material 26 (FIG. 2) is deposited and patterned using conventional photolithography steps. After patterning, an initial opening 27 (FIG. 2) is formed in the photoresist layer 26 for subsequent oxide etching. The first insulating layer 24 of FIG. 2 is then etched, to form a contact opening 40, and the photoresist layer 26 is removed, as shown in FIG. 3. The contact opening 40 extends to the source/drain region 16 provided in the well 13 of the substrate 12.

Figure 4:
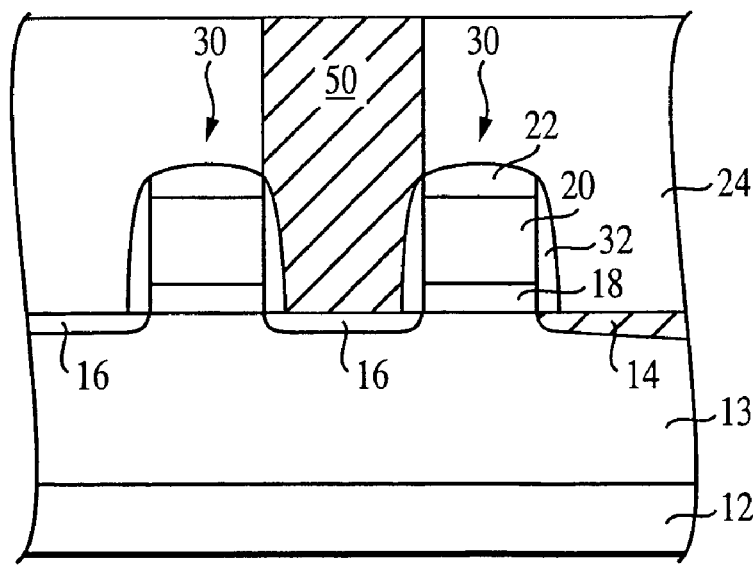
FIG. 4 is a schematic cross-sectional view of the FIG. 1 device at a stage of processing subsequent to that shown in FIG. 3.
Figure 5:
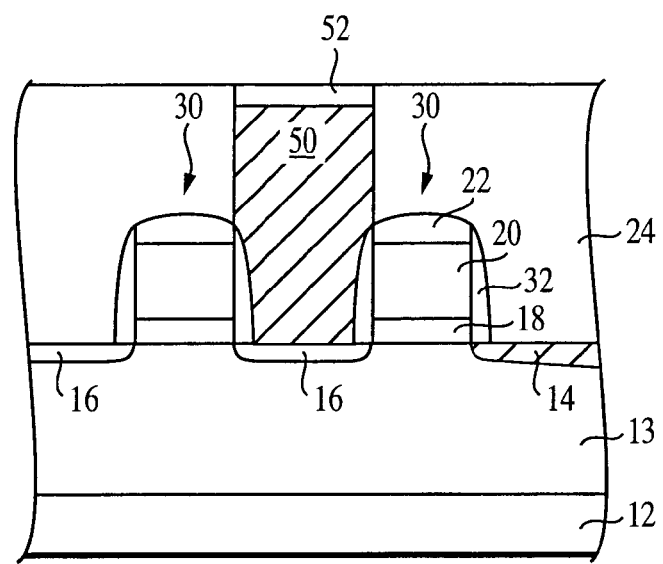
FIG. 5 is a schematic cross-sectional view of the FIG. 1 device at a stage of processing subsequent to that shown in FIG. 4.

Next, contact opening 40 (FIG. 3) is filled with a conductive material, such as doped polysilicon, that is planarized down to or near the planar surface of the first insulating layer 24, to form a polysilicon plug or filler 50, as illustrated in FIG. 4. The polysilicon plug 50 is then anisotropically etched until its top surface is recessed below the planar surface of the first insulating layer 24, so that a barrier layer 52 (FIG. 5) can be deposited and planarized, as shown in FIG. 5. The barrier layer 52, preferably of titanium (Ti), is formed on the polysilicon plug 50 by CVD, PVD, sputtering or evaporation, to a thickness of about 60 to about 200 Angstroms. The titanium barrier layer 52 will form titanium silicide ($TiSi_2$) during a later high temperature anneal.

Although the present invention is described with reference to the formation of an MIS capacitor 100 (FIG. 18) over the polysilicon plug 50, including the barrier layer 52, it must be understood that the existence of the barrier layer 52 is optional, and that the present invention also applies to capacitors formed over polysilicon plugs without protective barrier layer 52.

Figure 6:
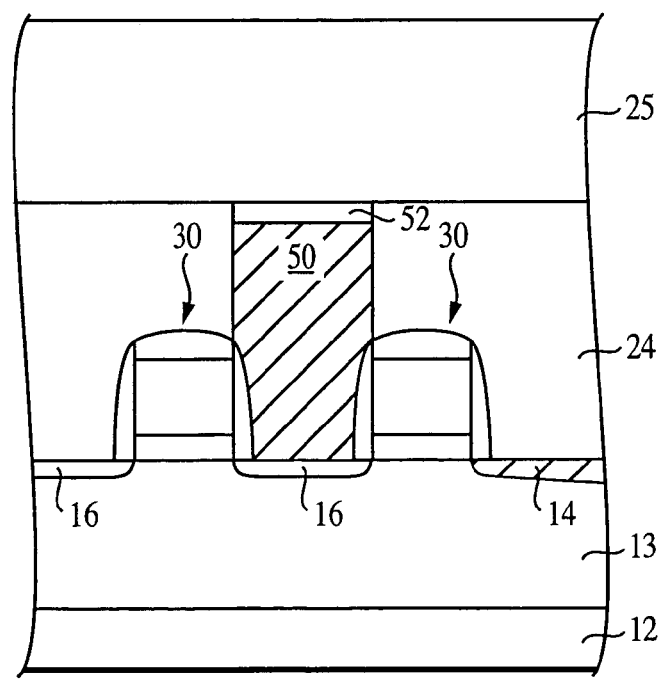
FIG. 6 is a schematic cross-sectional view of the FIG. 1 device at a stage of processing subsequent to that shown in FIG. 5.

FIG. 6 illustrates the deposition of a second insulating layer 25, which could be, for example, a silicon oxide, borophosphosilicate glass (BPSG), borosilicate glass (BSG), phosphosilicate glass (PSG), or tetraethylortho silicate (TEOS). The second insulating layer 25 is deposited over the barrier layer 52 and the first insulating layer 24. Again, using the same fabrication technique as that used for the formation of contact opening 40 (FIG. 3) through the first insulating layer 24, a capacitor opening 41 (FIG. 7) is formed through the second insulating layer 25.

Figure 7:
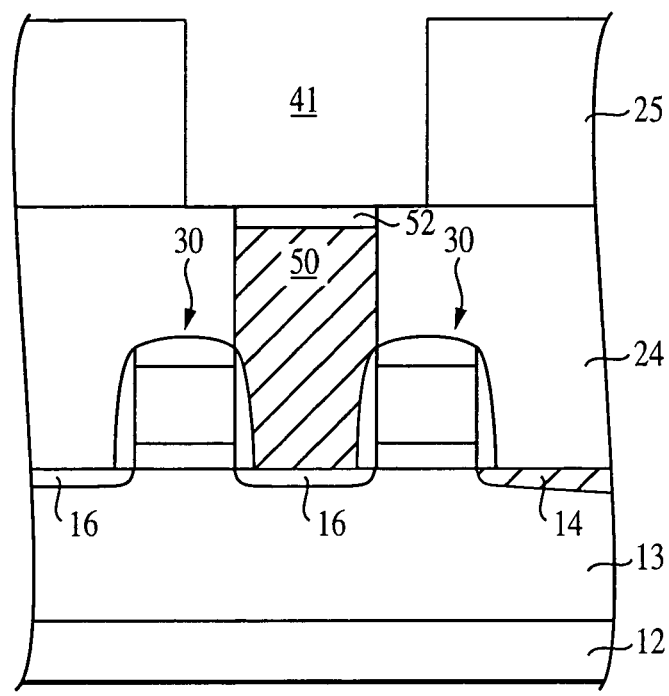
FIG. 7 is a schematic cross-sectional view of the FIG. 1 device at a stage of processing subsequent to that shown in FIG. 6.
Figure 8:
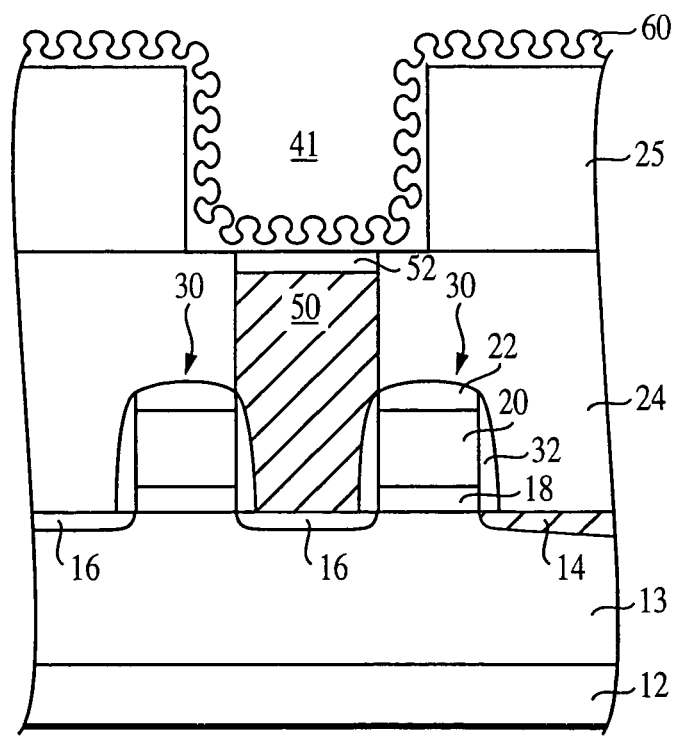
FIG. 8 is a schematic cross-sectional view of the FIG. 1 device at a stage of processing subsequent to that shown in FIG. 7.

Subsequent to the formation of capacitor opening 41 of FIG. 7, a layer 60 of semiconductive material is formed inside the capacitor opening 41 and over the upper surface of the insulating layer 25, as illustrated in FIG. 8. Layer 60 of semiconductive material may comprise hemispherical grained polysilicon (HSG), silica, silicon, germanium, or any alloy of silica or germanium. Preferably, layer 60 of semiconductive material is formed of hemispherical grained polysilicon (HSG). If HSG is employed, the layer 60 may be formed by first depositing a layer of in-situ doped polysilicon followed by a deposition of undoped HSG. Subsequent heating inherent in wafer processing could effectively conductively dope the overlying HSG layer. Alternatively, the HSG layer 60 may be provided by in-situ arsenic doping of an entire HSG layer, or by depositing amorphous silicon and then using a selective seed followed by an annealing process. The HSG layer 60 is in electrical contact with the previously formed conductive plug 50 over the active area 16. Although the present invention will be described below with reference to layer 60 of semiconductive material as to the HSG layer 60, it must be understood that this embodiment is only exemplary and the invention is not limited to it.

Figure 9:
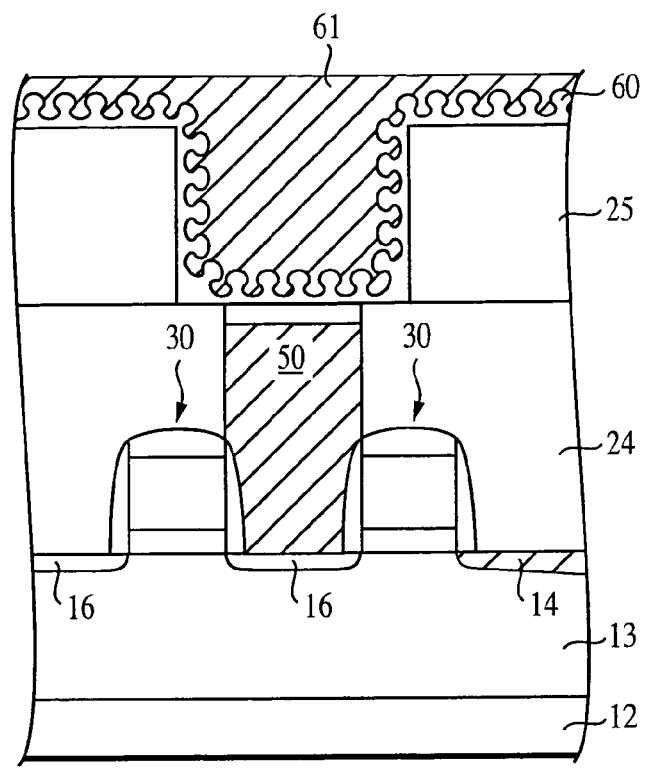
FIG. 9 is a schematic cross-sectional view of the FIG. 1 device at a stage of processing subsequent to that shown in FIG. 8.
Figure 10:
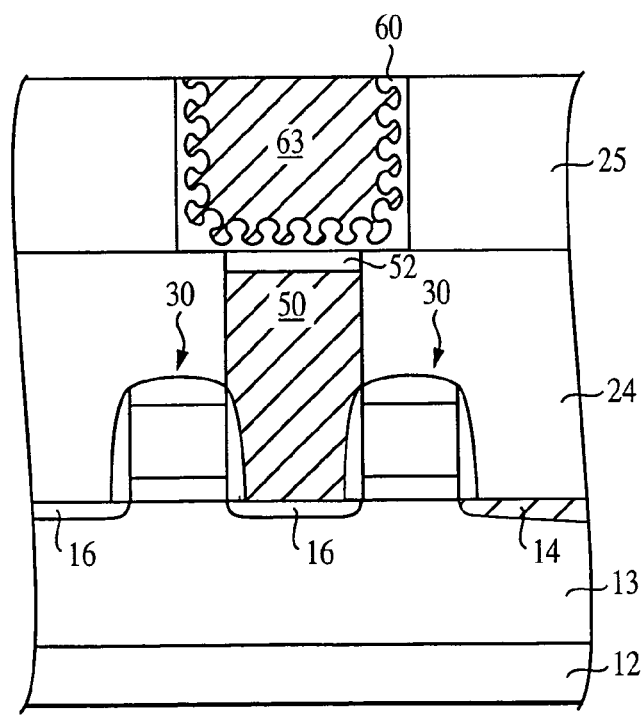
FIG. 10 is a schematic cross-sectional view of the FIG. 1 device at a stage of processing subsequent to that shown in FIG. 9.

Referring now to FIG. 9, the capacitor opening 41 of FIG. 8 is next filled with a photoresist material 61 by, for example, spin coating at room temperature and then solidifying it. The photoresist material 61, which can be any photochemical resin used in the semiconductor industry, as well as the horizontal portions of the HSG layer 60 located above the second insulating layer 25, are then planarized by CMP down to or near the planar surface of the upper surface of the second insulating layer 25 to form a photoresist plug 63 (FIG. 10). The photoresist plug 63 acts as a protective barrier for portions of the HSG layer 60 which contact the vertical walls of the contact opening 41, as well as for the horizontal portion of the HSG layer 60 which is situated above the polysilicon plug 50.

Figure 11:
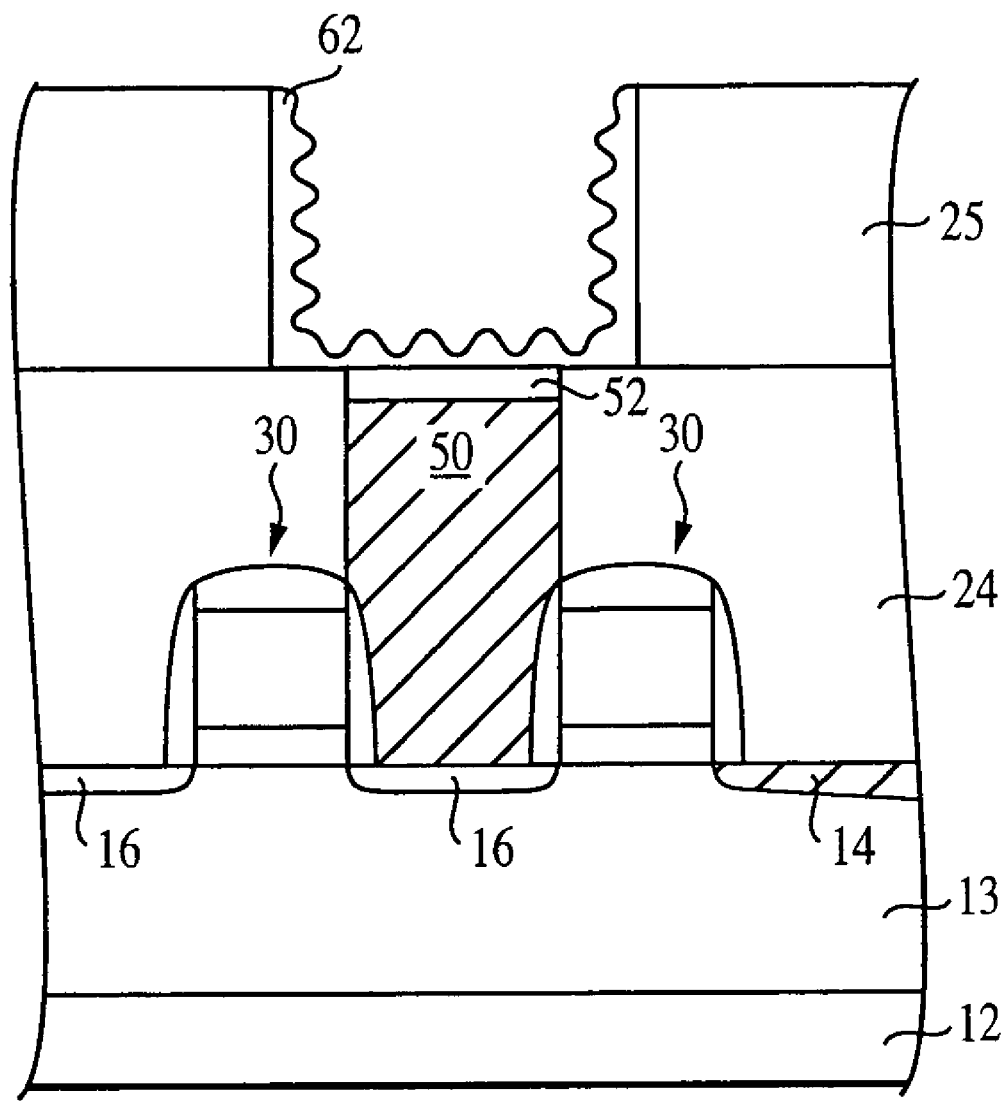
FIG. 11 is a schematic cross-sectional view of the FIG. 1 device at a stage of processing subsequent to that shown in FIG. 10.

Next, the chemically mechanically polished photoresist plug 63 (FIG. 10) is removed by using conventional techniques, such as ashing or plasma etching, to form the structure of FIG. 11. Upon removal of the photoresist plug 63, the HSG layer 60 may be optionally cleaned with a dilute cleaning solution, for example, a dilute solution of hydrofluoric acid (HF) with a 10:1 volumetric ratio of water to 49% HF, to remove any impurities and/or material residue present on the HSG layer 60.

Subsequent to the removal of the photoresist plug 63 and of the optional cleaning step described above, the HSG layer 60 may be further subjected to an etching solution, for example, a hydrofluoric acid (HF) etching solution, to form an etched HSG layer 62, as illustrated in FIG. 11. The etching solution removes any native oxide formed over the HSG layer 60 and further enlarges the openings of the HSG grains and activates the HSG grains of the HSG layer 60. This way, the etched HSG layer 62 with activated HSG grains allows the subsequently deposited dielectric material to achieve good conformal properties with the etched HSG layer 62 and better step coverage.

According to an embodiment of the present invention, the etched HSG layer 62 (FIG. 11) may be optionally subjected to a nitridizing or an oxidizing ambient to density the etched HSG layer 62 and, therefore, to decrease the leakage and increase the cell capacitance. The nitridizing or oxidizing ambient of the present invention also passivates the surface of the etched HSG layer 62 to prevent the unwanted diffusion and reactions between the etched HSG layer 62 and the oxide material of the subsequently deposited dielectric material. In this manner, the passivated surface of the etched HSG layer 62, which is a result of the nitridizing or oxidizing ambient, prevents any ion permeation in the etched HSG layer 62 such as oxygen ions from the subsequently deposited aluminum oxide layer 70 (FIG. 12) into the etched HSG layer 62. The passivation of the etched HSG layer 62 also eliminates the need for high temperature anneals which are typically required for the formation of a conventional oxide dielectric layer as part of a capacitor stack on an HSG layer.

As such, the etched HSG layer 62 may be subjected to a nitridizing ambient, for example, a rapid thermal nitridation (RTN) process, a remote plasma nitridization (RPN) process, an in-situ remote RF nitridization, or a combination of these processes. If an RPN process is employed, the substrate 12 may be placed in a reaction chamber and the etched HSG layer 62 may be subsequently exposed to a nitrogen-containing plasma formed from $N_2$ and $H_2$ within the reaction chamber. An exemplary nitrogen-containing plasma mixture comprises by volume from about 10% to about 80% of $N_2$ and from about 20% to about 90% $H_2$, at a temperature of from about 100° C. to about 800° C., more preferably of about 400° C. to about 600° C. The nitrogen-containing plasma mixture may further comprise argon (Ar) or another inert gas, typically in a percentage of about 0.01% to about 40% argon or inert gas, by volume.

Alternatively, the etched HSG layer 62 may be subjected to an anneal treatment, such as an in-situ $PH_3$ anneal at about 750° C. and for about 30 minutes. A nitrogen ($N_2$) or ammonia ($NH_3$) plasma anneal, or any other nitrogen source plasma anneal, may be also employed with or without an inert gas for annealing the etched HSG layer 62 to confer a better interface between the etched HSG layer 62 and the subsequently formed metal oxide dielectric layer.

If a rapid thermal nitridization (RTN) process is used for passivating the surface of the etched HSG layer 62 and, consequently, for improving the cell capacitance and reducing the leakage, the rapid thermal nitridization (RTN) process may take place at temperatures ranging from about 600° C. to about 1200° C., more preferably between about 600°

C. to about 800° C., for a time period ranging from about 5 seconds to about 60 seconds, preferably from about 20 seconds to about 60 seconds.

In another embodiment of the present invention, the etched HSG layer 62 may be subjected to an oxidizing ambient, for example, a remote plasma oxidation (RPO) ambient using an oxygen ($O_2$) or ozone ($O_3$) source, with or without ultraviolet light. A wet oxidizing chemistry may be also used to induce the passivation of the surface of the etched HSG layer 62.

According to yet another embodiment of the present invention, the etched HSG layer 62 may be subjected to both an anneal treatment, such as an in-situ $PH_3$ anneal, and a rapid thermal nitridization (RTN) process. For example, the etched HSG layer 62 may be first subjected to an in-situ $PH_3$ anneal at about 750° C. and for about 30 minutes followed by an RTN treatment at about 800° C. for about 60 seconds. According to another embodiment of the present invention and to further improve the capacitance and decrease the leakage, a cleaning step may be performed before the anneal treatment. For example, a dilute cleaning solution such as a dilute hydrofluoric acid (HF) solution having a 10:1 volumetric ratio of water to 49% HF may be used before the in-situ $PH_3$ anneal.

According to yet another embodiment of the invention, a cleaning step may be performed after the $PH_3$ treatment and before the rapid thermal nitridization (RTN) process. For example, a dilute cleaning solution such as a dilute hydrofluoric acid (HF) solution having a 10:1 volumetric ratio of water to 49% HF may be used after the in-situ $PH_3$ anneal and before the nitridization step outlined above. To further improve the capacitance and decrease the leakage, the etched HSG layer 62 may be also subjected to a first cleaning step before the $PH_3$ treatment, and to a second cleaning step after the $PH_3$ treatment and before the RTN anneal. The first and second cleaning steps may employ the same or different cleaning solutions.

Figure 12:
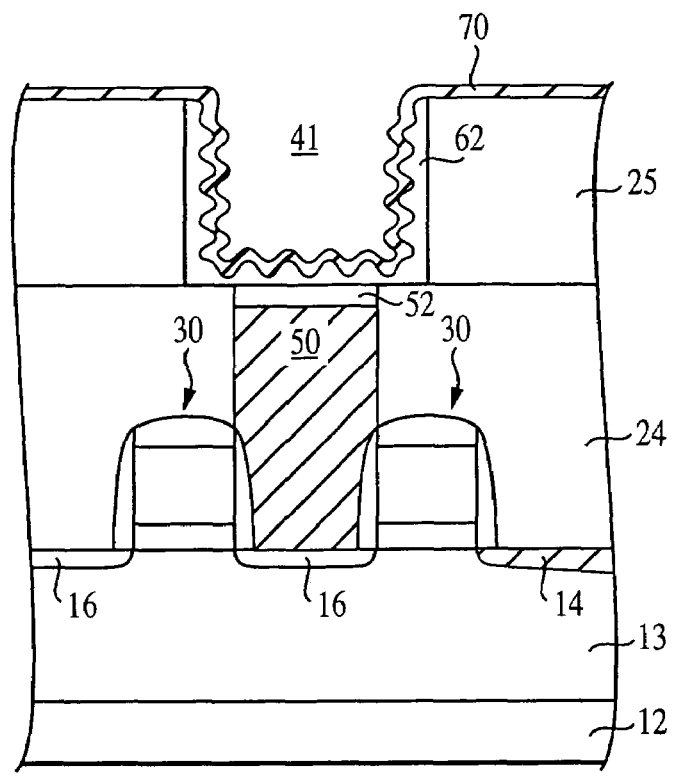
FIG. 12 is a schematic cross-sectional view of the FIG. 1 device at a stage of processing subsequent to that shown in FIG. 11.

Referring now to FIG. 12, after the processing of the etched HSG layer 62, a dielectric layer 70 is formed over the etched HSG layer 62 and the top surface of the second insulating layer 25. According to a preferred embodiment of the invention, the dielectric layer 70 is formed of aluminum oxide ($Al_2O_3$) material and reference to the dielectric layer 70 will be made in this application as to the aluminum oxide ($Al_2O_3$) layer 70. Aluminum oxide is preferred over other dielectric metal oxide materials, such as tantalum oxide ($Ta_2O_5$), for example, because aluminum oxide is more stable than these dielectric oxides at high processing temperatures. In addition, unlike the majority of dielectric oxides including $Ta_2O_5$ which require oxidation anneal temperatures higher than 700° C. and about several hours of oxidation, aluminum oxide structures do not require an oxidation anneal after $Al_2O_3$ deposition. As known in the art, metal oxide dielectric films such as $Ta_2O_5$ films require oxidation anneals after their deposition. The oxidation anneal also forms an oxynitride layer which grows at the $HSG/Ta_2O_5$ interface, for example. Unfortunately, although the oxynitride layer formed at the $HSG/Ta_2O_5$ interface decreases the leakage current significantly, it also reduces the effective permittivity and, therefore, the overall capacitance of the MIS structure. As aluminum oxide structures do not require an oxidation anneal after $Al_2O_3$ deposition, the formation of a low permittivity oxynitride layer at the $HSG/Al_2O_3$ dielectric interface is eliminated and the capacitance of the MIS structure is not affected negatively.

The $Al_2O_3$ dielectric layer 70 (FIG. 12) may be formed by a deposition technique, for example chemical vapor deposition (CVD), metalorganic chemical vapor deposition (MOCVD) or sputtering, among others, to a thickness of about 10 Angstroms to about 500 Angstroms, more preferably of about 25 Angstroms to about 100 Angstroms.

In yet another exemplary embodiment of the present invention, the $Al_2O_3$ dielectric layer 70 of FIG. 12 is formed by an atomic layer deposition (ALD) technique to further improve the quality of the dielectric film. According to this embodiment, a first species of aluminum precursor, such as an aluminum source precursor, for example trimethyl-aluminum (TMA), is first deposited over the surface of the etched HSG layer 62 (FIG. 11) and the second insulating layer 25 as a first monolayer. A second species of oxygen precursor, which may be an oxygen ($O_2$), an ozone ($O_3$) or water ($H_2O$) source, for example, is next applied over the monolayer of the first species of precursor. The second species of precursor reacts with the monolayer of the first species of precursor to form an aluminum oxide ($Al_2O_3$) layer.

Each of the $Al_2O_3$ layers of the first and second species of precursors is provided on the surface of the etched HSG layer 62 and over the upper surface of the second insulating layer 25 by first pulsing the first species (also called first precursor gas) and then the second species (also called second precursor gas) into the region of the surface of the etched HSG layer 62 and of the second insulating layer 25. The sequence of depositing the monolayers of the first and second species of precursors can be repeated cycle after cycle and as often as needed, until a desired thickness is reached for the $Al_2O_3$ dielectric layer 70. Between each of the precursor gas pulses, the process region is exhausted and a pulse of purge gas is injected. In any event, the thickness of the $Al_2O_3$ dielectric layer 70 formed by the ALD process outlined above is in the range of about 10 Angstroms to about 100 Angstroms, more preferably of about 25 Angstroms to about 50 Angstroms.

Figure 13:
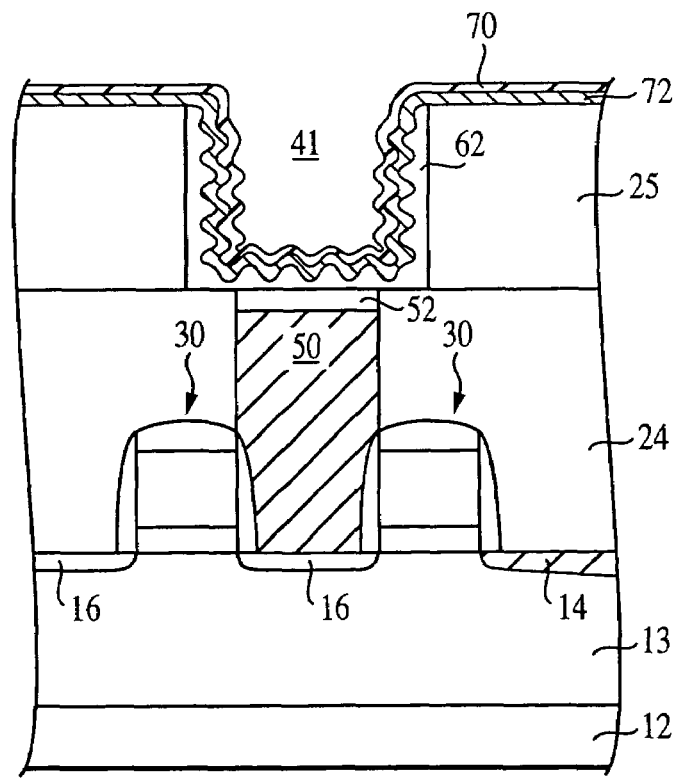
FIG. 13 is a schematic cross-sectional view of the FIG. 1 device at a stage of processing subsequent to that shown in FIG. 11 and in accordance with another embodiment of the present invention.
Figure 14:
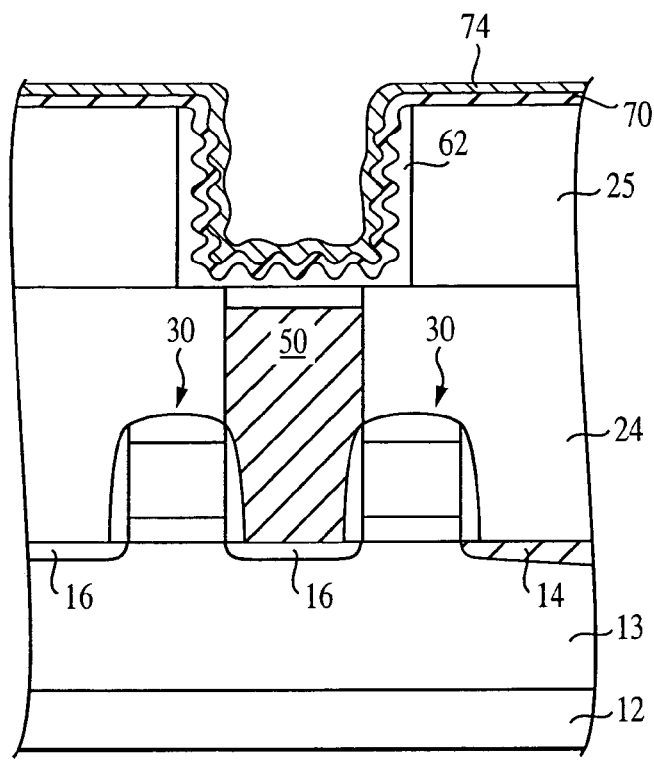
FIG. 14 is a schematic cross-sectional view of the FIG. 1 device at a stage of processing subsequent to that shown in FIG. 11 and in accordance with an embodiment of the present invention.
Figure 15:
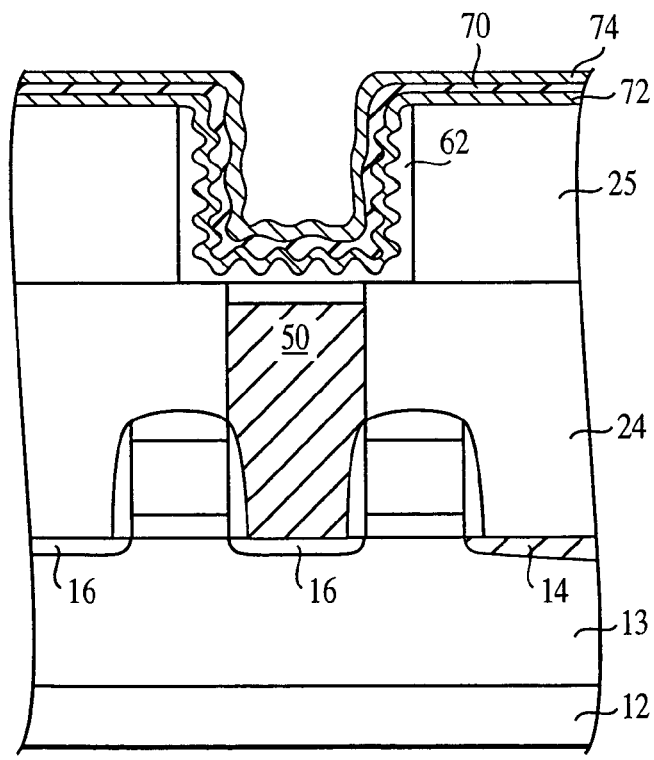
FIG. 15 is a schematic cross-sectional view of the FIG. 1 device at a stage of processing subsequent to that shown in FIG. 11 and in accordance with an embodiment of the present invention.

FIGS. 13-15 illustrate exemplary embodiments of the present invention, according to which at least one aluminum-containing interfacial layer is formed between the $Al_2O_3$ dielectric layer 70 and the etched HSG layer 62, and/or between the $Al_2O_3$ dielectric layer 70 and the subsequently formed upper electrode. For example, FIG. 13 illustrates an interfacial Al—O—Si layer 72 formed at the etched HSG layer 62/$Al_2O_3$ dielectric layer 70 interface. FIG. 14 illustrates an interfacial Al-metal-O—N layer 74 formed at the $Al_2O_3$ dielectric layer 70/upper electrode interface. FIG. 15 illustrates both an interfacial Al—O—Si layer 72 and an interfacial Al-metal-O—N layer 74 formed at the respective interfaces of the $Al_2O_3$ dielectric layer 70 with the etched HSG layer 62 and with the upper electrode to be formed.

The incorporation of silicon atoms in the aluminum-containing interfacial Al—O—Si layer 72 confers a smooth and continuous interface between the polysilicon of the etched HSG layer 62 and the dielectric material of the $Al_2O_3$ dielectric layer 70. Similarly, the incorporation of metal atoms in the aluminum-containing interfacial Al-metal-O—N layer 74 also confers a smooth and continuous interface between the dielectric material of the $Al_2O_3$ dielectric layer 70 and the conductive material of the metal nitride upper electrode.

The interfacial Al—O—Si layer 72 of FIGS. 13 and 15 may be formed to a thickness of about 5 Angstroms to about 50 Angstroms, by a deposition process, for example chemical vapor deposition (CVD), using an aluminum source, an oxygen source and a silicon source as precursors. For example, the Al—O—Si layer 72 may be formed using trimethyl-aluminum (TMA) as the aluminum source precursor, ozone ($O_3$) as the oxygen source precursor, and silane as the silicon source precursor, at a temperature of about 100° C. to about 800° C., more preferably of about 400° C.

According to a preferred embodiment of the invention, the interfacial Al—O—Si layer 72 of FIGS. 13 and 15 may be formed in-situ during the formation of the $Al_2O_3$ dielectric layer 70 of FIG. 12. For example, the interfacial Al—O—Si layer 72 (FIGS. 13, 15) may be formed in-situ during the atomic layer deposition of the $Al_2O_3$ dielectric layer 70, using a similar sequence of steps described above for the formation of the $Al_2O_3$ dielectric layer 70. According to the ALD embodiment, a first species of aluminum precursor, such as an aluminum source precursor, for example trimethyl-aluminum (TMA), is first deposited over the surface of the etched HSG layer 62 (FIG. 11) and the second insulating layer 25 as a first monolayer. A second species of oxygen precursor, which may be an oxygen ($O_2$) or an ozone ($O_3$) source, or water ($H_2O$) for example, is next applied over the monolayer of the first species of precursor. The second species of precursor reacts with the monolayer of the first species of precursor to form an aluminum oxide ($Al_2O_3$) layer. A third species of silicon precursor, which may be silane or a multiple-order silane such as di-silane or tri-silane, is next applied over the monolayer of the first and second species of precursor to form an Al—O—Si layer. The sequence of depositing the monolayers of the first, second and third species of precursors is repeated cycle after cycle and as often as needed, until the thickness for the interfacial Al—O—Si layer 72 (FIGS. 13, 15) is of about 5 Angstroms to about 50 Angstroms.

The interfacial Al-metal-O—N layer 74 of FIGS. 14 and 15 formed at the $Al_2O_3$ dielectric layer 70/upper electrode interface may be also formed to a thickness of about 5 Angstroms to about 50 Angstroms, by either a deposition technique or by atomic layer deposition. The metal component of the interfacial Al-metal-O—N layer 74 is similar to the metal component of the metal nitride material which will form the upper electrode. For example, if the upper electrode to be formed comprises titanium nitride (TiN) material, then the interfacial Al-metal-O—N layer 74 is an interfacial Al—Ti—O—N layer 74. Similarly, if the upper electrode to be formed comprises tungsten nitride (WNx) material, then the interfacial Al-metal-O—N layer 74 is an interfacial Al—W—O—N layer 74. Although, for simplicity, reference to the Al-metal-O—N layer 74 will be made below as to the Al—Ti—O—N layer 74, it must be understood that the invention is not limited to this embodiment and the invention contemplates the formation of various interfacial Al-metal-O—N layers 74, according to the metal of choice of the metal nitride upper electrode to be formed.

According to one embodiment of the invention, the Al—Ti—O—N layer 74 (FIGS. 14, 15) may be formed to a thickness of about 5 Angstroms to about 100 Angstroms, by a deposition process, for example atomic layer deposition (ALD), using an aluminum source, a titanium source, an oxygen source and a nitrogen source as precursors. For example, the Al—Ti—O—N layer 74 may be formed using trimethyl-aluminum (TMA) as the aluminum source precursor, titanium tetrachloride ($TiCl_4$) as the titanium source, ozone ($O_3$) as the oxygen source precursor, and ammonia ($NH_3$) source as the nitrogen source precursor, at a temperature of about 100° C. to about 800° C., more preferably of about 400° C.

According to a preferred embodiment of the invention, the interfacial Al—Ti—O—N layer 74 of FIGS. 14 and 15 may be formed in-situ during the formation of the $Al_2O_3$ dielectric layer 70 (FIG. 12) and of the interfacial Al—O—Si layer 72 (FIGS. 13, 15). For example, the interfacial Al—Ti—O—N layer 74 (FIGS. 14, 15) may be formed in-situ during the atomic layer deposition of the $Al_2O_3$ dielectric layer 70 and of the Al—Ti—O—N layer 74, using a similar sequence of steps described above for the formation of the $Al_2O_3$ dielectric layer 70 (FIG. 12). As such, monolayers of aluminum, titanium, oxygen and nitrogen species precursors, are sequentially deposited cycle after cycle and as often as needed, until the thickness for the interfacial Al—Ti—O—N layer 74 of FIGS. 14 and 15 is of about 5 Angstroms to about 100 Angstroms.

Figure 16:
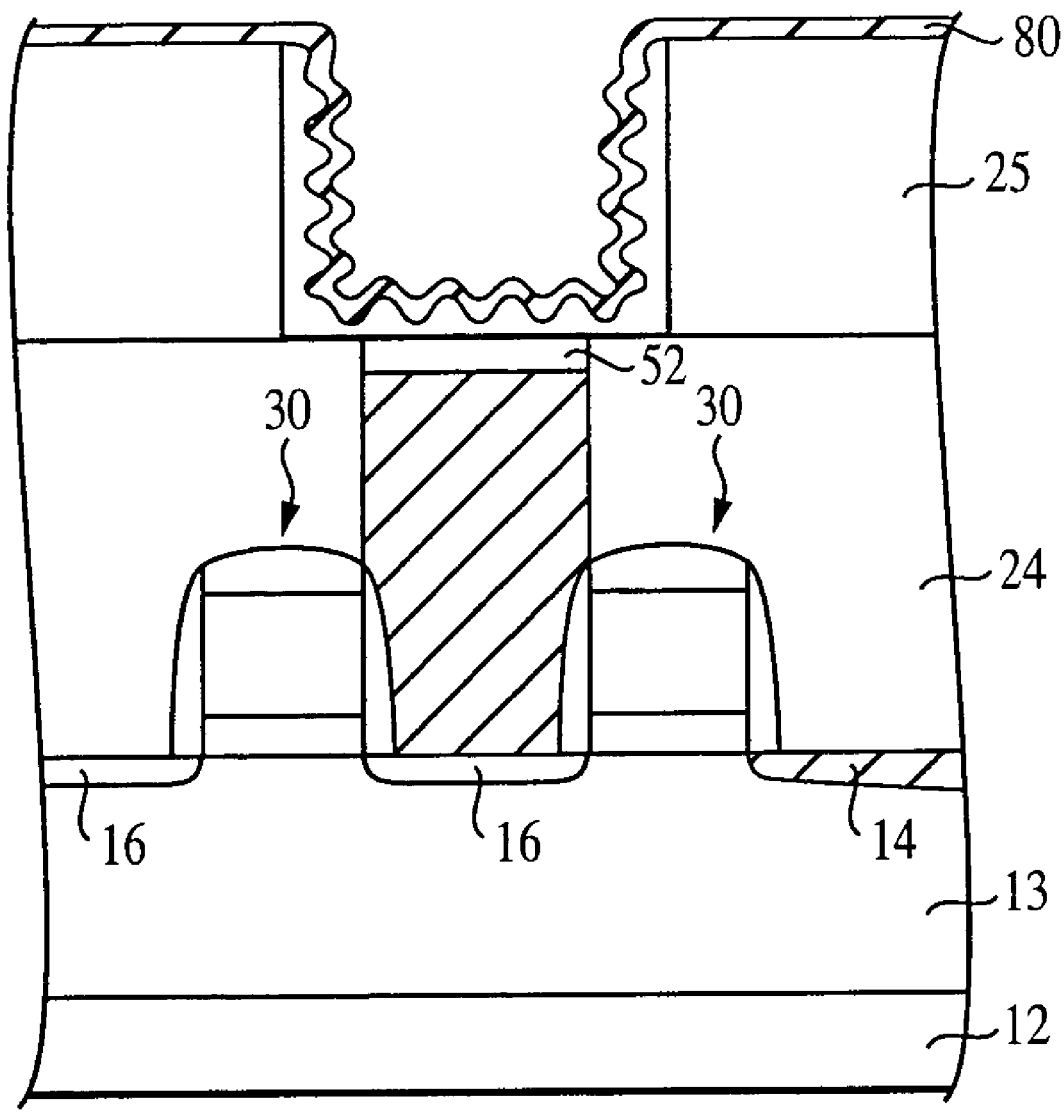
FIG. 16 is a schematic cross-sectional view of the FIG. 1 device at a stage of processing subsequent to that shown in FIG. 11.

FIG. 16 illustrates yet another embodiment of the present invention, according to which a dielectric $Al_2O_3$ composite stack layer 80 is formed over the etched HSG layer 62 and the upper surface of the second insulating layer 25. The $Al_2O_3$ composite stack layer 80 may comprise one or more layers of aluminum oxide interleaved with one or more layers of other dielectric materials such as tantalum oxide, ($Ta_2O_5$), zirconium oxide ($ZrO_2$), hafnium oxide (HfO), a hafnium-aluminum-oxygen alloy (Hf—Al—O), or a lanthanum-aluminum-oxygen alloy (La—Al—O), among others.

For example, the composite stack layer 80 may be an in-situ deposited composite stack of $Al_2O_3/Ta_2O_5$ (aluminum oxide/tantalum oxide), or an in-situ deposited composite stack of $Al_2O_3/Ta_2O_5/Al_2O_3$ (aluminum oxide/tantalum oxide/aluminum oxide), or a composite stack comprising a plurality of interleaved and alternating layers of $Al_2O_3$ (aluminum oxide) and $Ta_2O_5$ (tantalum oxide). Since the permittivity of bulk $Al_2O_3$ (aluminum oxide) is lower than that of $Ta_2O_5$ (tantalum oxide), the addition of $Ta_2O_5$ (tantalum oxide) to a composite stack comprising $Al_2O_3$ (aluminum oxide) significantly increases the overall permittivity of the composite stack. Also, since $Al_2O_3$ has a dielectric constant (of about 9-12) lower than the dielectric constant of $Ta_2O_5$ (of about 18-45), the addition of $Ta_2O_5$ further increases the total dielectric constant of the $Al_2O_3/Ta_2O_5$ (aluminum oxide/tantalum oxide) or $Al_2O_3/Ta_2O_5/Al_2O_3$ (aluminum oxide/tantalum oxide/aluminum oxide) stacks and thus the total capacitance. In addition, a smooth HSG/$Al_2O_3$ interface is achieved without any need for an additional interfacial layer. In any event, the total thickness of the $Al_2O_3$ composite stack layer 80 is of about 10 Angstroms to about 500 Angstroms, more preferably of about 25 Angstroms to about 100 Angstroms.

The $Al_2O_3$ composite stack layer 80 may be further formed as a plurality of interleaved layers of $Al_2O_3$ and other dielectric oxides, for example, zirconium oxide ($ZrO_2$), hafnium oxide (HfO), a hafnium-aluminum-oxygen alloy (Hf—Al—O), or a lanthanum-aluminum-oxygen alloy (La—Al—O), among others. The $Al_2O_3$ composite stack layer 80 may be also formed as a plurality of interleaved layers of $Al_2O_3$ and a combination of dielectric metal oxides, for example, a combination of any of zirconium oxide ($ZrO_2$), hafnium oxide (HfO), a hafnium-aluminum-oxygen alloy (Hf—Al—O), or a lanthanum-aluminum-oxygen alloy (La—Al—O), among others. In such cases, each of the aluminum oxide and of the dielectric metal oxides may be formed by either a deposition technique, for example chemical vapor deposition (CVD) or plasma enhanced chemical vapor deposition (PECVD), or by atomic layer deposition (ALD), the processing details of which were described above with reference to the formation of the $Al_2O_3$ dielectric layer 70 of FIG. 12. Each of the above-mentioned layers or plurality of interleaved layers of the $Al_2O_3$ composite stack layer 80 may be formed in-situ during the formation of the aluminum oxide layer, for example, via ALD.

Subsequent to the formation of the $Al_2O_3$ dielectric layer 70 (FIG. 12) or of the $Al_2O_3$ composite stack layer 80 (FIG. 16), the dielectric material may be further subjected to a post-$Al_2O_3$ deposition treatment to further increase the stack stability and the stack capacitance without degrading the leakage current. The post-$Al_2O_3$ deposition treatment of the present invention replaces the conventional post-oxidation anneal, also known in the art as reoxidation, which conventional dielectric oxides must undergo after their initial formation to significantly reduce the leakage current. As known in the art, dielectric oxides formed over a lower capacitor electrode have oxygen ($O_2$) vacancies, the presence of which significantly affects the leakage current. To decrease the number of unwanted oxygen vacancies, the dielectric oxide is subjected to a reoxidation treatment which, although significantly decreasing the leakage current, also adversely affects the physical and electrical properties of the dielectric oxide and of the underlying polysilicon material, particularly as a result of the high oxidation temperatures. As described in more detail below with reference to FIG. 20, the formation of a 55 Angstroms $Al_2O_3$ dielectric layer which undergoes a post-$Al_2O_3$ deposition confers acceptable leakage values without the conventional reoxidation treatment required for dielectric oxide materials.

Accordingly, as part of the post-$Al_2O_3$ deposition treatment for increasing the stack stability and the stack capacitance without degrading the leakage current, the $Al_2O_3$ dielectric layer 70 (FIG. 12) or the $Al_2O_3$ composite stack layer 80 (FIG. 16) may be subjected to a mild surface nitridization process. This way, the dielectric layers 70, 80 may be exposed to a nitridizing ambient under an RTN treatment from about 500° C. to about 900° C. for about 60 seconds. Alternatively, the $Al_2O_3$ dielectric layer 70 or the $Al_2O_3$ composite stack layer 80 may be exposed to a nitrogen-containing plasma formed from $N_2$ and $H_2$ within the reaction chamber. An exemplary nitrogen-containing plasma mixture comprises by volume from about 10% to about 80% of $N_2$ and from about 20% to about 90% $H_2$, at a temperature of from about 100° C. to about 800° C., more preferably of about 400° C. to about 600° C. The nitrogen-containing plasma mixture may further comprise argon (Ar) or another inert gas, typically in a percentage of about 0.01% to about 40% argon or inert gas, by volume.

Figure 17:
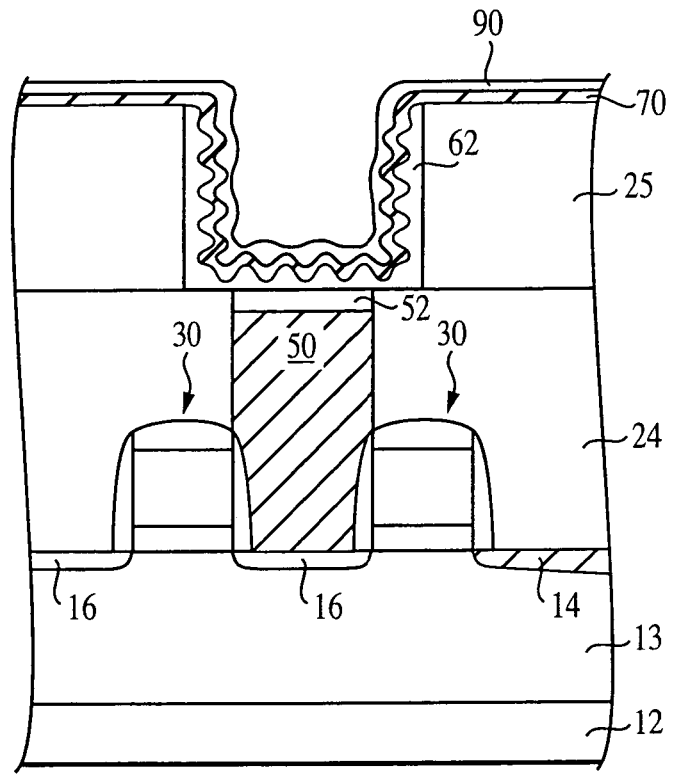
FIG. 17 is a schematic cross-sectional view of the FIG. 1 device at a stage of processing subsequent to that shown in FIG. 12.
Figure 18:
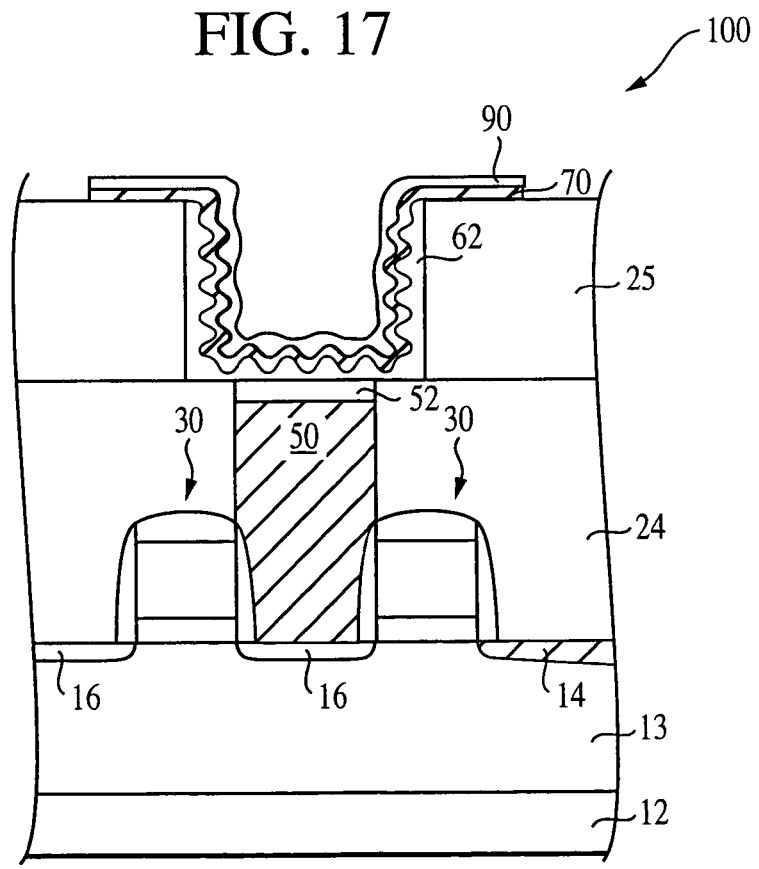
FIG. 18 is a schematic cross-sectional view of the FIG. 1 device at a stage of processing subsequent to that shown in FIG. 17.

Referring now to FIG. 17, after the processing of the dielectric layer is completed, a metal nitride layer 90 is formed as an upper capacitor electrode 90 to complete the formation of the MIS capacitor 100 (FIG. 18). Although the completion of the formation of the MIS capacitor 100 (FIG. 18) is explained below with reference to an upper capacitor electrode formed over the $Al_2O_3$ dielectric layer 70 (FIG. 12), it must be understood that this embodiment is only exemplary. Accordingly, the present invention also contemplates the formation of an upper electrode over other $Al_2O_3$ dielectric structures formed according to embodiments of the present invention, for example the $Al_2O_3$ dielectric layer 70 with the interfacial layers 72, 74 (FIGS. 13-15), or the $Al_2O_3$ composite stack layer 80 (FIG. 16).

As illustrated in FIG. 17, the metal nitride layer 90 is formed over the $Al_2O_3$ dielectric layer 70 of FIG. 12 to a thickness of about 10 Angstroms to about 1,000 Angstroms, more preferably of about 50 Angstroms to about 250 Angstroms. The metal nitride layer 90 (FIG. 17) may be formed, for example, of titanium nitride (TiN) material which is an extremely hard material that is almost chemically inert (although it dissolves readily in hydrofluoric acid) and has excellent conductive properties. Titanium nitride also has a high melting point (about 3000° C.), which makes it unaffected by high processing temperatures and by most reagents.

According to an embodiment of the present invention, the titanium nitride layer 90 may be formed by a chemical vapor deposition (CVD) process using a metal source and a nitrogen source as precursors, at a temperature of about 500° C. to about 800° C., more preferably of about 600° C. For example, the titanium nitride layer 90 may be formed using a nitrogen source, such as an ammonia ($NH_3$) source, and a titanium source precursor containing chlorine (Cl), such as $TiCl_4$ (titanium tetrachloride), $(C_5H_5)_2TiCl_2$ [bis(cyclopentadienyl)titanium dichloride] or $(C_5H_5)TiCl_3$ (cyclopentadienyltitanium trichloride), among others. Alternatively, the titanium nitride layer 90 may be formed by a low-temperature chemical vapor deposition (CVD) process by adding $(CH_3)HNNH_2$ (methylhydrazine) to a titanium source containing chlorine (Cl), for example $TiCl_4$ (titanium tetrachloride). A metalorganic precursor such as $TiN[CH_2(CH_3)_2]_4$ (tetrakis diethylamino titanium or TDEAT) or $Ti[N(CH_3)_2]_4$ (tetrakis dimethylamino titanium or TDMAT) may be also used with a nitrogen source precursor to form the titanium nitride layer 90 of FIG. 17.

According to yet another embodiment of the present invention, the titanium nitride layer 90 (FIG. 17) may be formed by an atomic layer deposition (ALD) process. Because the ALD process takes place at low temperatures, the low ALD temperatures prevent the degradation of the $Al_2O_3$ dielectric layer 70 during the ALD processing steps. The low ALD temperatures also prevent the formation of additional oxygen vacancies in the aluminum oxide material, which typically occur as a result of high processing temperatures.

If ALD processing is employed, a first species of precursor, which may be a titanium source precursor containing chlorine (Cl), such as $TiCl_4$ (titanium tertachloride) for example, is first deposited over the surface of the dielectric layer 70 (FIG. 12) as a first monolayer. A second species of precursor, which may be an ammonia ($NH_3$) source, for example, is next applied over the monolayer of the first species of precursor. The second species of precursor reacts with the monolayer of the first species of precursor to form a titanium nitride (TiN) layer. Each of the TiN layers of the first and second species of precursors are provided on the surface of the dielectric layer 70 by first pulsing the first species (also called first precursor gas) and then the second species (also called second precursor gas) into the region of the surface of the dielectric layer 70. The sequence of depositing the monolayers of the first and second species of precursors can be repeated cycle after cycle and as often as needed, until a desired thickness is reached for the titanium nitride (TiN) layer 90. Between each of the precursor gas pulses, the process region is exhausted and a pulse of purge gas is injected. The thickness of the titanium nitride, layer 90 formed by the ALD process outlined above is in the range of about 10 Angstroms to about 250 Angstroms, more preferably of about 100 Angstroms to about 200 Angstroms.

According to another embodiment of the present invention, the metal nitride layer 90 is formed of boron-doped titanium nitride (TiBN) material having a boron doping concentration of from about 0.01% to about 30% (atomic percentage). Incorporation of boron into a titanium nitride (TiN) film may be achieved by exposing the titanium nitride film to $B_2H_6$ at a temperature of from about 200° C. to about 600° C., at a pressure of from about 1 Torr to about 20 Torr, and for a period of time of about 10 seconds to about 60 minutes to convert the titanium nitride film to the boron-doped titanium nitride layer 90 (FIG. 17). Alternatively, the incorporation of boron into a titanium nitride (TiN) film may be achieved by exposing the titanium nitride film to $B_2H_6$ and further to ultraviolet (UV) light, at a temperature of from about 200° C. to about 600° C., at a pressure of from about 1 Torr to about 20 Torr, and for a period of time of about 10 seconds to about 60 minutes. Any wavelength in the ultraviolet range may be used for exposing the $B_2H_6$ and further incorporating the boron into the titanium nitride material. The boron-doped titanium nitride layer 90 (FIG. 17) may be also formed by a chemical vapor deposition (CVD) process using a $TiCl_4$ (titanium tetrachloride) source precursor, a $B_2H_6$ boron source and an ammonia ($NH_3$) source at a temperature of about 600° C. to about 800° C.

According to yet another embodiment of the present invention, the metal nitride layer 90 (FIG. 17) may be formed of tungsten nitride ($WN_x$) material by a chemical vapor deposition (CVD) process using a tungsten metal source and a nitrogen source as precursors. For example, the tungsten nitride layer 90 may be formed using a nitrogen source, such as an ammonia ($NH_3$) source, and a tungsten source precursor such as tungsten hexafluoride ($WF_6$), at a temperature of about 300° C. to about 500° C., more preferably of about 400° C.

According to yet another embodiment of the present invention, the tungsten nitride ($WN_x$) layer 90 (FIG. 17) may be formed by an atomic layer deposition (ALD) process, as described above with reference to the formation of the ALD-formed titanium nitride (TiN) layer 90. For this, a first species of precursor which may be a tungsten source precursor containing fluorine (F), such as tungsten hexafluoride ($WF_6$) for example, is first deposited over the initial surface of the $Al_2O_3$ dielectric layer 70 (FIG. 12) as a first monolayer. A second species of precursor, which may be a nitrogen ($N_2$) or an ammonia ($NH_3$) source, for example, is next applied over the monolayer of the first species of precursor. The second species of precursor reacts with the monolayer of the first species of precursor to form a tungsten nitride ($WN_x$) layer. Each of the $WN_x$ layers of the first and second species of precursors is provided on the surface of the $Al_2O_3$ dielectric layer 70 by first pulsing the first species and then the second species into the region of the surface of the $Al_2O_3$ dielectric layer 70. As explained above, the sequence of depositing the monolayers of the first and second species of precursors can be repeated cycle after cycle and as often as needed, until a desired thickness is reached for the tungsten nitride ($WN_x$) layer 90. Preferably, the thickness of the tungsten nitride layer 90 formed by the ALD process outlined above is in the range of about 10 Angstroms to about 250 Angstroms, more preferably of about 100 Angstroms to about 200 Angstroms.

FIG. 18 illustrates the $Al_2O_3$ dielectric layer 70 and the metal nitride layer 90 patterned by a dry etch process, for example, to complete the formation of the MIS capacitor 100 having an upper capacitor electrode formed of metal nitride material. To this end, further well-known processing steps to create a functional memory cell containing the MIS capacitor 100 may now be carried out.

Figure 19:
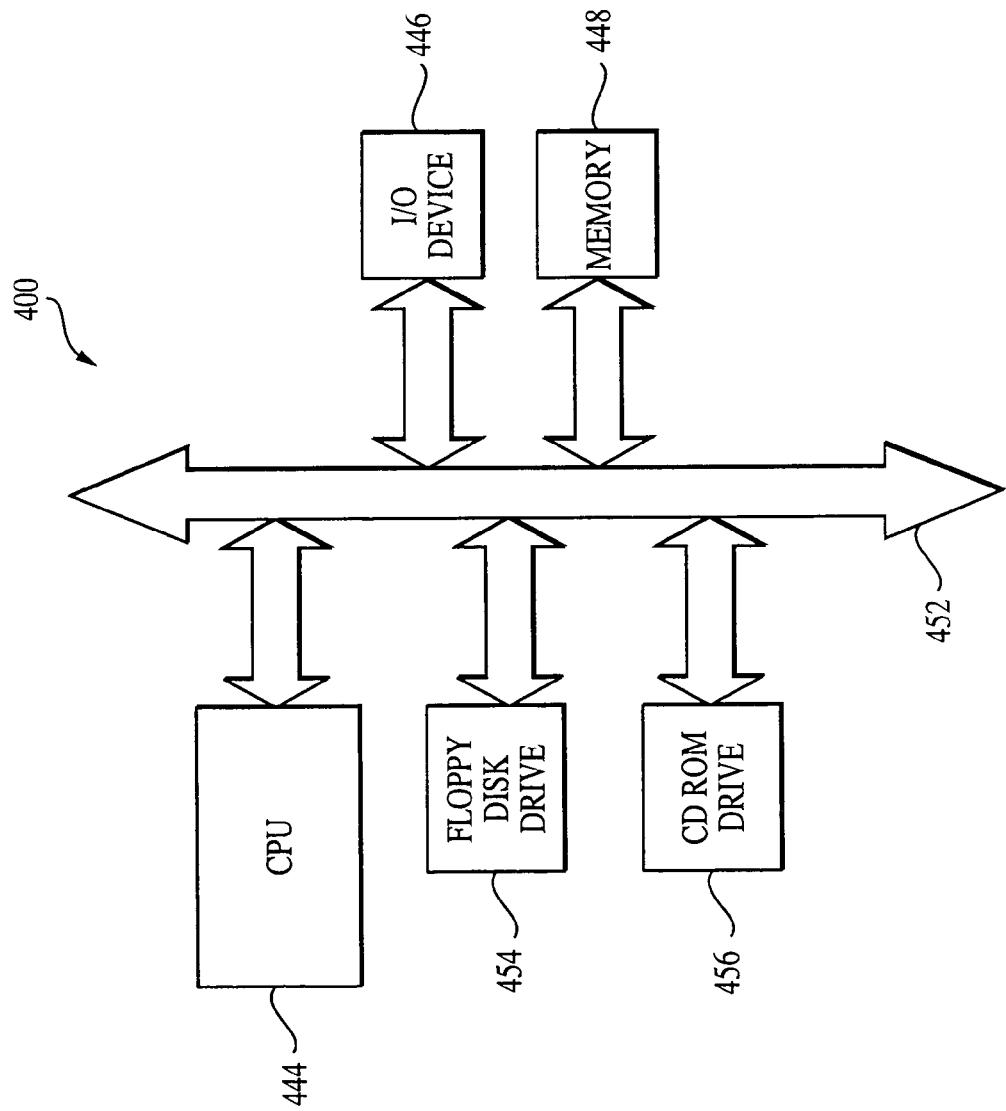
FIG. 19 is an illustration of a computer system having a memory device with an MIS capacitor constructed in accordance with the present invention.

A typical processor-based system 400 is illustrated in FIG. 19. The processor-based system 400 includes a memory circuit 448, for example a DRAM memory, a SRAM memory, a Multi Chip Module (MCM), or a memory module containing one or more DRAM memory devices, at least one having at least one MIS capacitor, such as the MIS capacitor 100 (FIG. 18) formed in accordance with the present invention. A processor system, which may be a computer system, generally comprises a central processing unit (CPU) 444, such as a microprocessor, a digital signal processor, or other programmable digital logic devices, which communicates with an input/output (I/O) device 446 over a bus 452. The memory 448 communicates with the CPU 444 for data exchange over bus 452 directly or though a memory controller.

Figure 20:
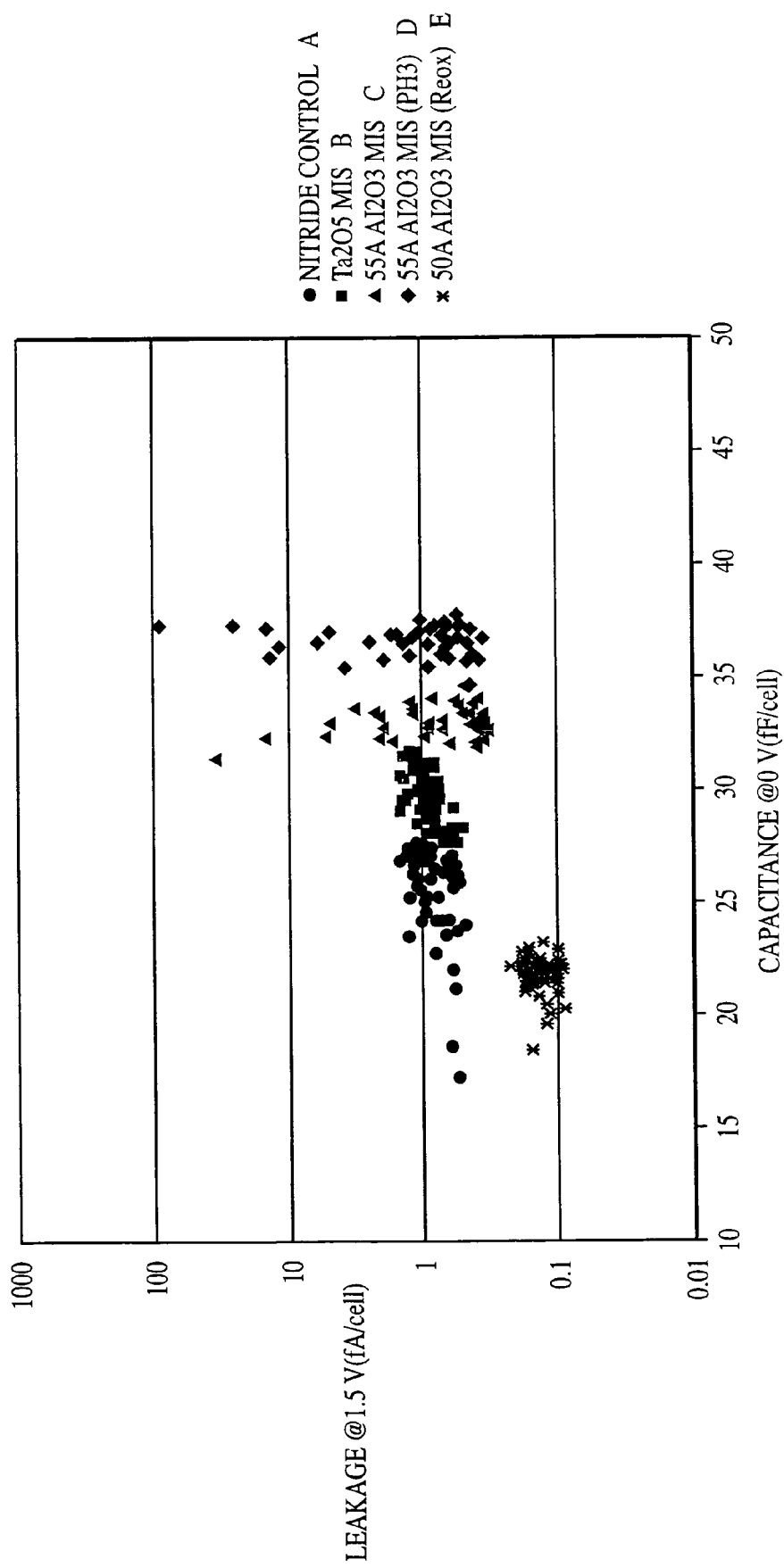
FIG. 20 is a graph illustrating data measurements for the leakage current and the capacitance of five MIS capacitors, of which three are fabricated according to embodiments of the present invention.

Examples of the implementation of the present invention will now be described with reference to FIG. 20. In each of the five sets of experiments which will be described in more detail below, the leakage currents of one control capacitor and four MIS capacitors, of which three were fabricated according to methods of the present invention, were measured and recorded. More specifically, two sets of measurements were run for a control capacitor and for one MIS capacitor formed according to embodiments of the prior art, and three sets of measurements were run for three MIS capacitors fabricated according to various embodiments of the present invention. The data from each set of measurements was recorded and illustrated in FIG. 20.

First Set of Experiments

Under a first set of experiments, an ONO capacitor was formed on a semiconductor wafer according to an embodiment of the prior art as a control capacitor. The control ONO capacitor was fabricated with a lower electrode of HSG of about 400 Angstroms thick, a silicon nitride ($Si_3N_4$) dielectric layer of about 50 Angstroms thick, and an upper electrode of polysilicon of about 200 Angstroms thick. The HSG lower electrode, the $Si_3N_4$ dielectric layer and the polysilicon upper electrode were formed by chemical vapor deposition (CVD) at a temperature of about 600° C.

A first group of measurements for the capacitance and leakage current of the control ONO capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the control ONO capacitor was recorded as region A in FIG. 20. As illustrated in FIG. 20, for capacitance values of about 22 to 29 fF/cell corresponding to the region A, the leakage current values are within 0.5 to 2.0 fA/cell.

Second Set of Experiments

Under a second set of experiments, a $Ta_2O_5$ MIS capacitor was formed on a semiconductor wafer according to another embodiment of the prior art. The $Ta_2O_5$ MIS capacitor was fabricated with a lower electrode of HSG of about 400 Angstroms thick, a $Ta_2O_5$ dielectric layer of about 40 Angstroms thick, and an upper electrode of titanium nitride (TiN) of about 200 Angstroms thick. The HSG lower electrode was formed by chemical vapor deposition (CVD) at a temperature of about 600° C. The $Ta_2O_5$ dielectric layer was also formed by chemical vapor deposition (CVD) at a temperature of about 475° C., while the titanium nitride upper electrode was formed by chemical vapor deposition (CVD) at a temperature of about 600° C.

A second group of measurements for the capacitance and leakage current of the $Ta_2O_5$ MIS capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the $Ta_2O_5$ MIS capacitor was recorded as region B in FIG. 20. For capacitance values of about 27 to 33 fF/cell corresponding to the region B of FIG. 20, the leakage current values are within 0.5 to 3.0 fA/cell.

Third Set of Experiments

Under a third set of experiments, a first $Al_2O_3$ MIS capacitor was formed on a semiconductor wafer according to a first embodiment of the present invention. The first $Al_2O_3$ MIS capacitor was fabricated with a lower electrode of CVD hemispherical grained polysilicon of about 400 Angstroms thick, an ALD $AM_2O_3$ dielectric layer of about 55 Angstroms thick, and an upper electrode of CVD titanium nitride of about 200 Angstroms thick.

The ALD $Al_2O_3$ dielectric layer of the first $Al_2O_3$ MIS capacitor was formed by atomic layer deposition using trimetyl-aluminum (TMA) as an aluminum source precursor and water. The titanium nitride upper electrode was formed by chemical vapor deposition, employing $TiCl_4$ (titanium tetrachloride) as precursor and ammonia ($NH_3$) as nitrogen source.

A third group of measurements for the capacitance and leakage current of the first $Al_2O_3$ MIS capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the first $Al_2O_3$ MIS capacitor was recorded as region C in FIG. 20. As illustrated in FIG. 20, for capacitance values of about 31 to 35 fF/cell corresponding to the region C, the leakage current values are within 0.4 to 2.0 fA/cell.

Fourth Set of Experiments

Under a fourth set of experiments, a second $Al_2O_3$ MIS capacitor was formed on a semiconductor wafer according to a second embodiment of the present invention. The second $Al_2O_3$ MIS capacitor was fabricated with a lower electrode of CVD deposited hemispherical grained polysilicon of about 400 Angstroms thick, an ALD $Al_2O_3$ dielectric layer of about 55 Angstroms thick subjected to a post-$Al_2O_3$ deposition treatment, and an upper electrode of CVD titanium nitride of about 200 Angstroms thick.

The ALD $Al_2O_3$ dielectric layer of the second $Al_2O_3$ MIS capacitor was formed by atomic layer deposition using trimetyl-aluminum (TMA) as an aluminum source precursor and water. The titanium nitride upper electrode was formed by chemical vapor deposition, employing $TiCl_4$ (titanium tetrachloride) as precursor and ammonia ($NH_3$) as a nitrogen source.

Prior to the formation of the ALD $Al_2O_3$ dielectric layer, the lower HSG electrode of the second $Al_2O_3$ MIS capacitor was subjected to the following sequence of treatments: (1) a dilute hydrofluoric acid (HF) solution having a 10:1 volumetric ratio of water to 49% HF; (2) an in-situ $PH_3$ anneal at about 750° C. and for about 30 minutes; (3) a dilute hydrofluoric acid (HF) solution having a 10:1 volumetric ratio of water to 49% HF; and (4) an RTN treatment at about 800° C. for about 60 seconds in a nitrogen atmosphere.

A fourth group of measurements for the capacitance and leakage current of the second $Al_2O_3$ MIS capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the second $Al_2O_3$ MIS capacitor was recorded as region D in FIG. 20. For capacitance values of about 35 to 38 fF/cell corresponding to the region D of FIG. 20, the leakage current values are within 0.5 to 3.0 fA/cell.

Fifth Set of Experiments

Under a fifth set of experiments, a third $Al_2O_3$ MIS capacitor was formed on a semiconductor wafer according to a third embodiment of the present invention. The third $Al_2O_3$ MIS capacitor was fabricated with a lower electrode of CVD deposited hemispherical grained polysilicon of about 400 Angstroms thick, an ALD $Al_2O_3$ dielectric layer of about 50 Angstroms thick and subjected to a reoxidation treatment, and an upper electrode of CVD titanium nitride of about 200 Angstroms thick.

The ALD $Al_2O_3$ dielectric layer of the third $Al_2O_3$ MIS capacitor was formed by atomic layer deposition using trimethyl-aluminum (TMA) as an aluminum source precursor and water. Subsequent to its formation, the ALD $Al_2O_3$ dielectric layer of the third $Al_2O_3$ MIS capacitor was subjected to a post-deposition oxidation treatment. This way, the ALD $Al_2O_3$ dielectric layer underwent an oxidizing ambient under an ozone treatment at about 475° C. for about 3 minutes. The titanium nitride upper electrode was formed by chemical vapor deposition, employing $TiCl_4$ as precursor and ammonia ($NH_3$) as a nitrogen source.

A fifth group of measurements for the capacitance and leakage current of the third $Al_2O_3$ MIS capacitor described above was conducted from various die locations across the wafer. The capacitance measurements were conducted at 1 kHz and zero (0) bias, and the corresponding leakage current measurements were conducted at 1.5 V DC bias and at about 85° C. The distribution of the leakage current vs. capacitance measurements for the third $Al_2O_3$ MIS capacitor was recorded as region E in FIG. 20. As illustrated in FIG. 20, for capacitance values of about 20 to 24 fF/cell corresponding to the region E, the leakage current values are within 0.1 to 0.4 fA/cell.

The results of the five sets of experiments detailed above demonstrate that the leakage current of an MIS capacitor fabricated according to various embodiments of the present invention is substantially decreased when the ALD $Al_2O_3$ dielectric layer is subjected to a reoxidation treatment, such as the ozone reoxidation at about 475° C. for about 3 minutes explained above with reference to the fifth group of measurements. This is exemplified by region E of FIG. 20, according to which the leakage current values for the third $Al_2O_3$ MIS capacitor fall between 0.1 to 0.4 fA/cell. However, the capacitance values corresponding to region E of FIG. 20 are also unacceptably low compared to the capacitance values of the other four capacitors and their corresponding regions A, B, C and D of FIG. 20.

The results of the five sets of experiments also demonstrate that subjecting the HSG lower electrode to a $PH_3$ anneal and an RTN treatment before the formation of the ALD $Al_2O_3$ dielectric layer substantially increases the capacitance values. FIG. 20 shows that the highest capacitance values among all MIS capacitors correspond to region D of the second $Al_2O_3$ MIS capacitor. The capacitance values of the second $Al_2O_3$ MIS capacitor, which fall between 35 to 38 fF/cell (region D of FIG. 20), are higher than the capacitance values of all other four regions A, B, C, and E corresponding to the other four capacitors.

Although the exemplary embodiments of the present invention have been described with reference to the formation of one MIS capacitor 100 (FIG. 18), the invention also contemplates the formation of a plurality of such capacitors, as desired in a DRAM memory array. In addition, the invention contemplates the fabrication of an MIS capacitor, such as the MIS capacitor 100 of FIG. 18, on an integrated circuit substrate which may include other capacitor structures, for example, conventional container capacitors, MIM or SIS capacitors, among others.

In addition, although the formation of the MIS capacitor 100 (FIG. 18) has been described with reference to the formation of the upper capacitor electrode 90 formed over the $Al_2O_3$ dielectric layer 70 (FIG. 12), the invention also contemplates the formation of an MIS capacitor comprising an upper capacitor electrode formed over the $Al_2O_3$ composite stack layer 80 (FIG. 16), which as described above may be, for example, an in-situ deposited composite stack of $Al_2O_3/Ta_2O_5/Al_2O_3$ (aluminum oxide/tantalum oxide/aluminum oxide), or over the $Al_2O_3$ dielectric layer 70 with at least one of the interfacial layers 72, 74 (FIGS. 13-15). Further, although $Al_2O_3$ (aluminum oxide) is the preferred dielectric material for the dielectric layer 70 (FIG. 12), the invention is not limited to aluminum oxide. Accordingly, the invention also contemplates the use of other dielectric materials which can form stable composite stacks with other oxide dielectric materials, such as tantalum oxide, ($Ta_2O_5$), zirconium oxide ($ZrO_2$), hafnium oxide (HfO), a hafnium-aluminum-oxygen alloy (Hf—Al—O), or a lanthanum-aluminum-oxygen alloy (La—Al—O), among others. The invention further contemplates the use of dielectric materials which are oxides and/or oxide combinations of scandium (Sc), yttrium (Y), lanthanum (La), titanium (Ti), zirconium (Zr), hafnium (Hf), vanadium (V), niobium (Nb), tantalum (Ta) and tungsten (W).

Accordingly, the above description and drawings are only to be considered illustrative of exemplary embodiments which achieve the features and advantages of the present invention. Modification and substitutions to specific process conditions and structures can be made without departing from the spirit and scope of the present invention. Thus, the invention is not to be considered as being limited by the foregoing description and drawings, but is only limited by the scope of the appended claims.

What is claimed as new and desired to be protected by Letters Patent of the United States is:

1. An MIS capacitor comprising:
    a lower electrode formed over a semiconductor substrate;
    a dielectric layer comprising aluminum oxide formed over said lower electrode;
    a metal nitride upper electrode formed over said dielectric layer; and
    a metal-doped layer at the interface between said dielectric layer and said metal nitride upper electrode.

2. The MIS capacitor of claim 1, wherein said metal-doped layer has a thickness of about 5 Angstroms to about 100 Angstroms.

3. The MIS capacitor of claim 1, wherein said metal-doped layer is an aluminum-titanium-oxygen-nitrogen layer.

4. The MIS capacitor of claim 1, wherein said metal-doped layer comprises a metal similar to the metal of said metal nitride upper electrode.

* * * * *